US007659213B2

(12) United States Patent  
Wei et al.

(10) Patent No.: US 7,659,213 B2
(45) Date of Patent: Feb. 9, 2010

(54) TRANSISTOR HAVING AN EMBEDDED TENSILE STRAIN LAYER WITH REDUCED OFFSET TO THE GATE ELECTRODE AND A METHOD FOR FORMING THE SAME

(75) Inventors: Andy Wei, Dresden (DE); Thorsten Kammler, Ottendorf-Okrilla (DE); Jan Hoentschel, Dresden (DE); Manfred Horstmann, Duerrroehrsdorf-Dittersbach (DE)

(73) Assignee: GlobalFoundries, Inc., Grand Cayman (KY)

( * ) Notice: Subject to any disclaimer, the term of this patent is extended or adjusted under 35 U.S.C. 154(b) by 483 days.

(21) Appl. No.: 11/566,840

(22) Filed: Dec. 5, 2006

(65) Prior Publication Data

US 2007/0254461 A1    Nov. 1, 2007

(30) Foreign Application Priority Data

Apr. 28, 2006  (DE) ........................ 10 2006 019 921

(51) Int. Cl.
*H01L 21/31*       (2006.01)
*H01L 21/42*       (2006.01)
*H01L 21/8222*     (2006.01)

(52) U.S. Cl. ........................ 438/766; 438/365; 438/514; 257/61; 257/E21.316; 257/E33.004

(58) Field of Classification Search .................. 438/365, 438/514, 766; 257/61, E33.004, E21.316
See application file for complete search history.

(56) References Cited

U.S. PATENT DOCUMENTS

| 4,751,193 | A | 6/1988 | Myrick ........................ 437/19 |
| 6,074,937 | A | 6/2000 | Pramanick et al. .......... 438/528 |
| 2004/0173815 | A1 | 9/2004 | Yeo et al. ..................... 257/192 |
| 2004/0235280 | A1* | 11/2004 | Keys et al. ................... 438/528 |
| 2006/0003561 | A1* | 1/2006 | Goktepeli .................... 438/528 |
| 2006/0088969 | A1 | 4/2006 | Jain ........................... 438/305 |
| 2007/0281413 | A1* | 12/2007 | Li et al. ....................... 438/201 |

OTHER PUBLICATIONS

Translated German office action dated Mar. 1, 2007.

* cited by examiner

*Primary Examiner*—Long K Tran
(74) *Attorney, Agent, or Firm*—Williams, Morgan & Amerson, P.C.

(57) ABSTRACT

By incorporating carbon by means of ion implantation and a subsequent flash-based or laser-based anneal process, strained silicon/carbon material with tensile strain may be positioned in close proximity to the channel region, thereby enhancing the strain-inducing mechanism. The carbon implantation may be preceded by a pre-amorphization implantation, for instance on the basis of silicon. Moreover, by removing a spacer structure used for forming deep drain and source regions, the degree of lateral offset of the strained silicon/carbon material with respect to the gate electrode may be determined substantially independently from other process requirements. Moreover, an additional sidewall spacer used for forming metal silicide regions may be provided with reduced permittivity, thereby additionally contributing to an overall performance enhancement.

21 Claims, 8 Drawing Sheets

TRANSISTOR HAVING AN EMBEDDED TENSILE STRAIN LAYER WITH REDUCED OFFSET TO THE GATE ELECTRODE AND A METHOD FOR FORMING THE SAME

BACKGROUND OF THE INVENTION

1. Field of the Invention

Generally, the present invention relates to the formation of integrated circuits, and, more particularly, to the formation of transistors having strained channel regions by using an embedded strained layer in the drain and source regions to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, for example, for compensating for short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, compressive strain in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source extension regions of the PMOS transistors are formed on the basis of ion implantation. Thereafter, respective sidewall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, a highly in situ doped silicon/germanium layer is selectively formed in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein. This integration scenario results in a significant performance gain of the P-channel transistors. Hence, a similar concept has been proposed for N-channel transistors by using a silicon/carbon material that has a smaller lattice spacing compared to silicon. In contrast to the former approach, the integration of an embedded silicon/carbon layer in the drain and source regions is difficult, due to the fact that currently established epitaxial growth processes for silicon/carbon may exhibit a poor selectivity, thereby resulting in a significant material deposition in unwanted device areas. Furthermore, the solubility of carbon in silicon during the epitaxial process is low. Consequently, based on conventional techniques, a concentration of 2-3% carbon in silicon, as is required for obtaining a desired gain in electron mobility, may be difficult to achieve.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique for forming silicon-based transistors including a strained silicon carbon material in the drain and source region in order to provide increased strain in the respective channel regions. The silicon/carbon material may be formed on the basis of an implantation process, thereby substantially avoiding the problems involved in selective epitaxial growth techniques used in conventional processes. Due to the incorporation of carbon material by ion implantation, a high degree of flexibility is achieved, in particular in combination with the formation of corresponding transistor elements including strained silicon/germanium material, since the carbon material may be implanted at any appropriate manufacturing stage while the respective P-channel transistors may be covered by a corresponding implantation mask. Furthermore, in some illustrative embodiments, the incorporation of the carbon material and the respective creation of a strained semiconductor material may be performed at a late stage of the manufacturing process with minimal influence on the overall device characteristics in that activation techniques may be used that significantly suppress any dopant diffusion while nevertheless providing an efficient carbon activation process. For example, flash-based and laser-based anneal techniques may be used in some illustrative embodiments to efficiently place respective carbon atoms at lattice sites in order to form the respective carbon/silicon material having a desired degree of tensile strain for enhancing the electron mobility in the respective channel region.

According to one illustrative embodiment of the present invention, a method comprises substantially amorphizing a portion of drain and source regions of a first silicon-based transistor and implanting carbon into the substantially amorphized portion. Moreover, the method comprises re-crystallizing the substantially amorphized portion in order to form a tensile strain layer in the drain and source regions.

According to another illustrative embodiment of the present invention, a method comprises forming drain and source regions of a first transistor in a silicon-based semiconductor layer by ion implantation and a first anneal process. Furthermore, carbon is implanted into the drain and source regions and finally a second anneal process is performed to activate the carbon to form a tensile strain layer in the drain and source regions.

According to yet another illustrative embodiment of the present invention, a method comprises implanting carbon into drain and source regions of a silicon transistor to provide a carbon concentration of at least approximately 1.5 atomic percent in a portion of the drain and source regions. Moreover, the implanted carbon is activated to form a strained layer in the drain and source regions.

BRIEF DESCRIPTION OF THE DRAWINGS

The invention may be understood by reference to the following description taken in conjunction with the accompanying drawings, in which like reference numerals identify like elements, and in which.

Figure 1A:
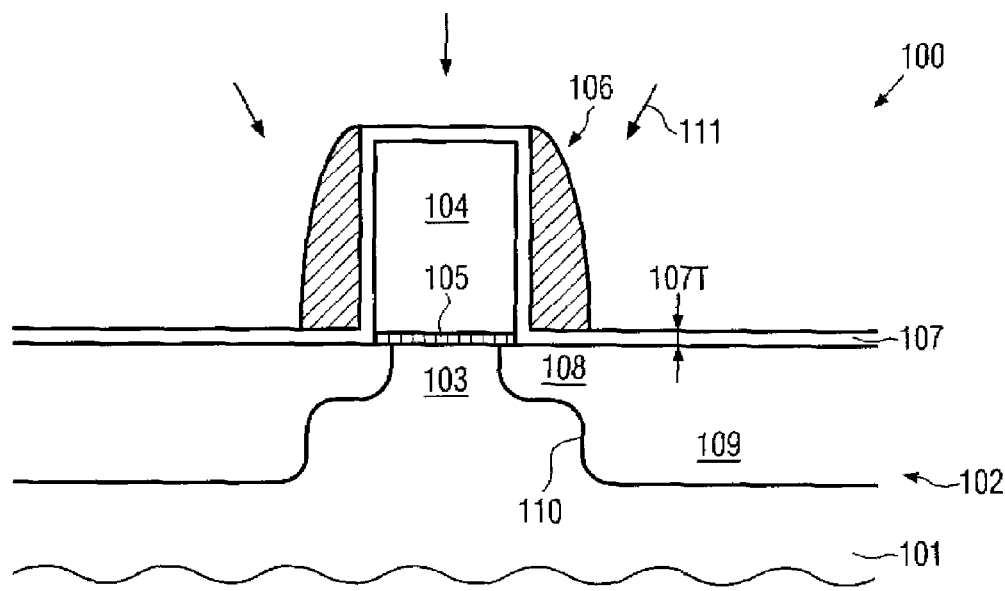
FIGS. 1a-1e schematically illustrate cross-sectional views of a transistor element during various manufacturing stages, in which a strained carbon/silicon layer is formed in an upper portion of drain and source regions by ion implantation according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention provides an efficient technique for the formation of strained silicon/carbon material in drain and source regions of a respective transistor element, wherein, in some illustrative embodiments, the strained silicon/carbon material may be positioned close to the channel region of the transistor element, thereby providing a highly efficient strain-inducing mechanism in the channel region. Moreover, the incorporation of a significant amount of carbon, as is required for obtaining a desired strain-inducing effect, may be performed on the basis of an ion implantation process, thereby avoiding the problems involved with selective epitaxial growth techniques for carbon doped silicon material. Introducing the carbon material on the basis of an ion implantation may provide a high degree of flexibility in implementing the manufacturing process for the strained silicon/carbon material into the entire process flow for forming sophisticated semiconductor devices, since the incorporation of the carbon material may be performed at any desired manufacturing stage and with high local selectivity, for instance, by providing respective implantation masks for covering other device areas, such as P-channel transistors, sensitive device areas and the like. Moreover, the implantation process for introducing the carbon material into the respective drain and source regions may be combined with highly efficient anneal techniques, such as flash-based and laser-based anneal techniques, in which short pulses of appropriate single wavelength or multi wavelength radiation is directed on the respective device surfaces, thereby providing a highly efficient activation mechanism, i.e., positioning respective carbon atoms or other silicon or non-silicon atoms at lattice sites, while substantially reducing or even avoiding pronounced diffusion of the respective carbon or other non-silicon atoms. Consequently, the carbon atoms may be efficiently activated, while other already existing implantation profiles may be substantially maintained. Hence, the carbon implantation and the subsequent radiation-based anneal processes may be performed at a very late stage during the transistor manufacturing process substantially without significantly affecting the transistor characteristics adjusted by the preceding process techniques. In some illustrative embodiments, the carbon implantation may be performed on the basis of spacer material or liner material providing a significantly reduced offset to the gate electrode, for instance compared to actual device spacer elements as typically used for the formation of deep drain and source regions, thereby positioning the respective carbon material and subsequently the respective strained silicon/carbon material very close to the channel region to provide a highly efficient strain-inducing mechanism.

Furthermore, the effectiveness of the implantation process as well as of the subsequent anneal sequence may be enhanced by performing an amorphization implantation prior to the carbon implantation, which may provide enhanced carbon localization accuracy due to reduced channeling effects and may also provide increased efficiency in the subsequent annealing process, as a substantially amorphized region may be re-crystallized more efficiently compared to crystalline areas that are heavily damaged by ion implantation. Moreover, in combination with the generation of a strained silicon/carbon material in the respective drain and source regions, additional performance gain may be accomplished by using appropriate spacer techniques in order to reduce the parasitic capacitance and/or provide enhanced stress transfer efficiency for a stressed overlayer.

With reference to FIGS. 1a-1i and 2a-2c, further illustrative embodiments of the present invention will now be described in more detail. FIG. 1a schematically illustrates in cross-sectional view a semiconductor device 100 comprising a substrate 101, such as a silicon bulk substrate, a silicon-on-insulator (SOI) substrate or any other appropriate carrier material, which has formed thereon a silicon-based semiconductor layer 102 that is appropriate for forming thereon and therein circuit elements, such as field effect transistors and the like. In this respect, a silicon-based semiconductor material is to be understood as a crystalline semiconductor layer comprising a significant amount of silicon, wherein, however, other non-silicon atoms may be present in a more or less significant amount. For example, a crystalline semiconductor layer comprising at least approximately 50 atomic percent silicon may be considered as a silicon-based semiconductor layer. The portion of the semiconductor device 100 as shown in FIG. 1a may represent an N-channel transistor element, in which at least a portion of the silicon-based layer 102 may be modified to exhibit a tensile strain therein in order to enhance the electron mobility therein, which thus results in an increased current drive capability of the respective transistor element. It should be appreciated that the semiconductor device 100 may comprise other circuit elements, such as P-channel transistors and the like, in which other strain-inducing mechanisms, such as compressively strained semiconductor material, may be provided in order to specifically enhance the drive current capabilities of these devices, as will be described later on with reference to FIGS. 2a-2c.

The semiconductor device 100 may further comprise in this manufacturing stage a gate electrode 104 that is formed on a respective gate insulation layer 105, which in turn separates the gate electrode 104 from the semiconductor layer 102, that is, from a channel region 103 defined in a portion of the layer 102. The gate electrode 104 of the device 100 may be comprised, in this manufacturing stage, of highly doped polysilicon as is typically used as gate electrode material in many well-established CMOS techniques. Moreover, in advanced applications, a gate length, i.e., a horizontal extension of the gate electrode 104 in FIG. 1a, may be approximately 100 nm and significantly less, for instance, even 50 nm and less, while a thickness of the gate insulation layer 105, which may be comprised of silicon dioxide, nitrogen-enriched silicon dioxide and the like, may range from one to several nanometers. Furthermore, a first sidewall spacer structure 106 is formed at sidewalls of the gate electrode 104 and may be comprised of any appropriate dielectric material, wherein, in some illustrative embodiments, silicon nitride may be used. Furthermore, a respective liner 107 is conformally formed above the device 100 and may have a high etch selectivity with respect to the material of the sidewall spacer structure 106. In some illustrative embodiments, the liner 107 may be comprised of silicon dioxide and a thickness 107T may be appropriately selected with respect to a subsequent carbon implantation process for providing a desired offset from the channel region 103 and for providing a desired degree of integrity during the further processing. For example, the thickness 107T may be selected from approximately 1-5 nm or more. Furthermore, the semiconductor device 100 may, in some illustrative embodiments, comprise in this manufacturing stage drain and source regions 109 including respective extension regions 108 as required for advanced transistor elements having a moderately short channel length. The drain and source regions 109 including the extensions 108 may therefore comprise a high concentration of an N-type dopant material so as to form respective PN junctions 110 with the channel region 103 and the remaining material of the layer 102. It should be appreciated that the device 100 may, in other illustrative embodiments, represent an SOI architecture, in which the deep drain and source regions 109 may extend down to a corresponding buried insulating layer (not shown) thereby providing reduced parasitic capacitance of the PN junction 110.

A typical process flow for forming the semiconductor device 100 as shown in FIG. 1a may comprise the following processes. After providing or manufacturing the substrate 101 having formed thereon the silicon-based semiconductor layer 102, appropriate isolation structures, such as shallow trench isolations (not shown), may be formed in order to define respective areas for the formation of circuit elements or groups of circuit elements, such as P-channel transistors, N-channel transistors and the like. The formation of the respective isolation structures may involve well-established photolithography, anisotropic etch, deposition and planarization techniques. Thereafter, any appropriate implantation processes may be performed in order to establish a specific vertical dopant profile in the respective areas of the semiconductor layer 102. Next, appropriate materials for the gate insulation layer 105 and the gate electrode 104 may be formed, for instance on the basis of advanced oxidation and/or deposition techniques for the gate insulation layer 105, while the gate electrode material may be formed on the basis of low pressure chemical vapor deposition techniques according to well-established recipes. Subsequently, the gate electrode material and the gate insulation layer material may be appropriately patterned on the basis of photolithography and advanced etch techniques, wherein respective capping layers (not shown) may be simultaneously patterned along with the gate electrode material to provide a respective capping layer, which may be required for an appropriate encapsulation of the gate electrodes in other device areas, such as areas corresponding to P-channel transistors for receiving a strained silicon/germanium material, as is also described with reference to FIGS. 2a-2c. After patterning of the gate electrode 104, and possibly after the selective formation of epitaxially grown semiconductor materials in other device regions, appropriate implantation processes may be performed, for instance on the basis of offset spacers (not shown) to introduce an N-type dopant material for forming the extension regions 108. Respective manufacturing processes for forming offset spacers, such as silicon dioxide spacers and performing a respective implantation process are well-established in the art. It should further be appreciated that the respective implantation processes may also include additional implantations, such as any pre-amorphization implants, if required, halo implantations and the like, depending on the process and device requirements. In still other illustrative embodiments, the liner 107 may be formed prior to the implantation for forming the extension regions 108 and may be used as a respective offset spacer. In this case, the thickness 107T may be selected so as to provide the desired lateral offset from the gate electrode 104.

Subsequently, the first spacer structure 106 may be formed on the basis of conformal deposition and anisotropic etch techniques in which, for instance, a silicon nitride layer may be formed on the basis of, for instance, low pressure chemical vapor deposition techniques and the like, followed by an anisotropic etch process, during which the liner 107 may act as an efficient etch stop layer in order to provide the respective spacer elements. Next, a further ion implantation may be carried out in order to introduce the N-type dopant material into the layer 102 for defining the deep drain and source regions 109, wherein, in some illustrative embodiments, the corresponding manufacturing sequence may comprise the formation of further sidewall spacer elements in the structure 106 followed by a corresponding implantation process, when the lateral profiling of the drain and source regions 109 in combination with the extension regions 108 may require more sophisticated dopant profiles.

Thereafter, an appropriate annealing process may be performed to activate the implanted dopants and also to re-crystallize, at least to a certain degree, implantation-induced damage in the semiconductor material 102. It should be noted that a corresponding anneal process may also be performed after the implantation of the extension regions 108, if desired. Annealing of the drain and source regions 109 and the extensions 108 may be performed on the basis of well-established recipes, which may include rapid thermal anneal techniques, oven-based techniques, radiation-based techniques and anneal techniques on the basis of pulsed radiation with high energetic short radiation pulses, such as laser-based and flash-based anneal techniques, or any appropriate combination thereof. In one illustrative embodiment, the corresponding anneal process may be designed so as to substantially create the finally required shape of the PN junctions 110 irrespective of a further carbon implantation and a respective carbon activation process.

Next, in one illustrative embodiment, a highly selective etch process 111 may be performed to remove the first spacer structure 106 selectively with respect to the liner material 107. For instance, in one illustrative embodiment, a highly selective wet chemical etch process on the basis of hot phosphoric acid may be used to selectively remove the spacer material of the structure 106, when comprised of silicon nitride, while the liner material 107 may reliably suppress any damage of the covered device areas. In other illustrative embodiments, other selective etch recipes, such as selective dry etch processes, may be used during the etch process 111 for effectively removing the first spacer structure 106. It should be appreciated that the selective etch process 111 may be performed substantially without masking other device areas, thereby also removing respective first spacer structures from other transistor elements, such as P-channel transistors and the like. If the presence of the first spacer structure in other device areas may be considered appropriate, for instance with respect to stress characteristics of the first spacer structure 106 and the like, a corresponding etch mask, for instance a resist mask, may be formed in order to reliably cover the respective device areas. A corresponding etch mask may be formed on the basis of well-established photolithography techniques.

Figure 1B:
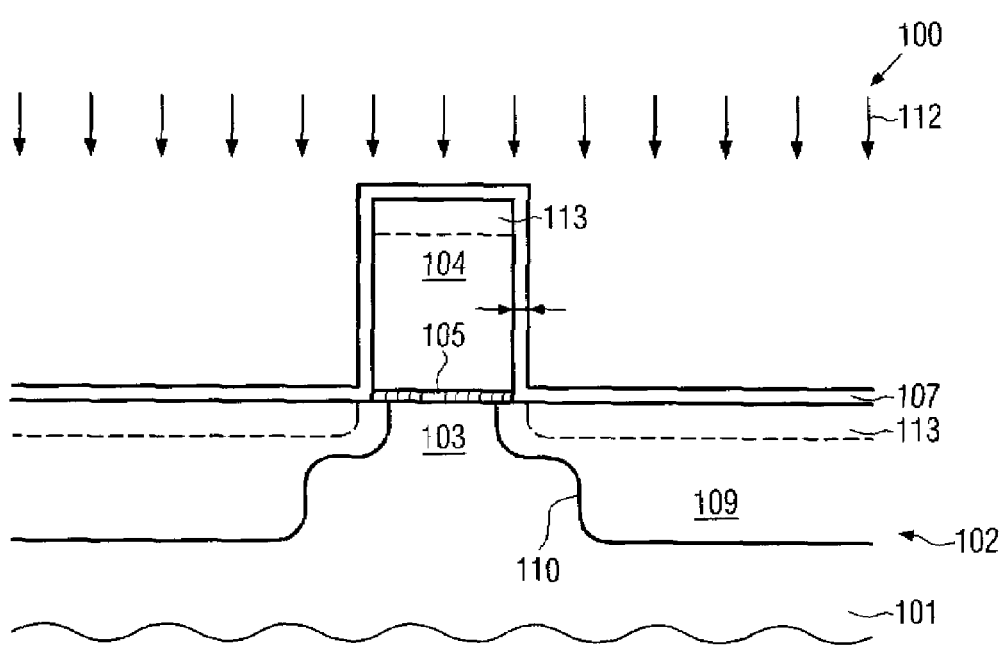

FIG. 1b schematically illustrates the semiconductor device 100 after the completion of the above-described selective etch process 111. Moreover, in one illustrative embodiment, the device 100 is exposed to an amorphization implantation 112 in order to form a substantially amorphized portion 113 within the drain and source regions 109 including the extensions 108. A corresponding substantial amorphization may also take place in an upper portion of the gate electrode 104, in which the substantially polycrystalline material is also modified by the implantation process 112. During the implantation 112, the thickness 107T of the liner 107 provides a desired offset to the gate electrode 104 and to the respective channel region 103 and also substantially suppresses any damage at the bottom corner of the gate electrode 104, thereby substantially maintaining the integrity of the gate insulation layer 105. In one illustrative embodiment, the implantation process 112 may be performed on the basis of silicon, which may generate a high degree of lattice damage in the substantially amorphized portion 113 without introducing significant non-silicon atoms. For example, with an implantation dose for silicon of approximately $1 \times 10^{15}$ ions/cm$^2$ and higher with an appropriate implantation energy in the range of approximately 5-50 keV, depending on the desired average penetration depth and the thickness 107T of the liner 107, a high degree of amorphization may be achieved in the portions 113. In other illustrative embodiments, any other heavy ion species may be implanted, such a xenon, or even heavy N-dopant materials, may be used in order to provide the desired degree of amorphization. Appropriate implantation parameters for a respective ion species may be readily established on the basis of respective simulation models and/or experiments. It should be appreciated that the implantation 112 may be designed such that the corresponding substantially amorphized portion 113 is located substantially within the drain and source regions 109 including the extensions 108, while, in other cases, when an extension of the portion 113 towards the channel region 103 is desired, respective implant tilt angles may be used for correspondingly shaping the portion 113.

Figure 1C:
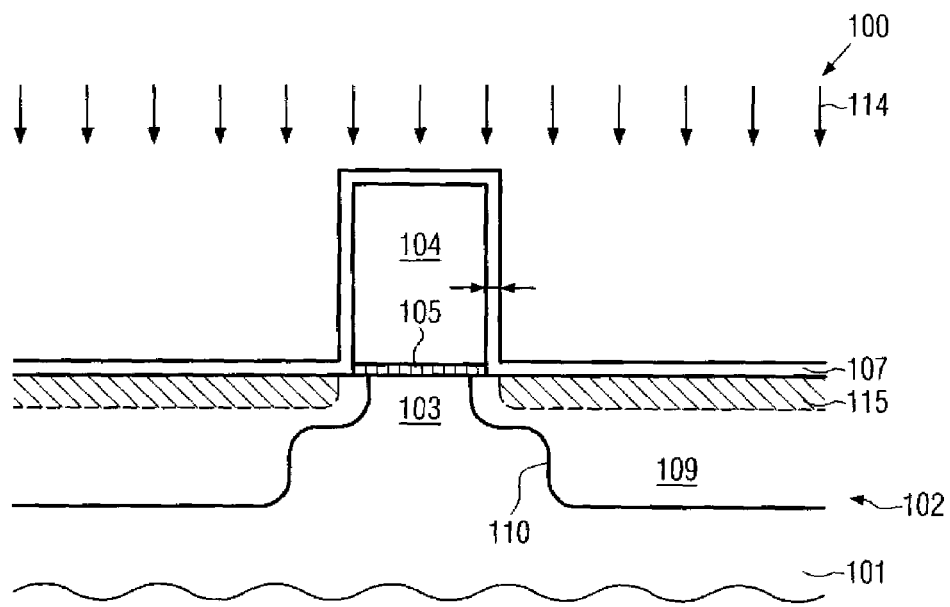

FIG. 1c schematically illustrates the semiconductor device 100 during a subsequent implantation process 114 to introduce carbon ions into the substantially amorphized portions 113, thereby forming a silicon/carbon material 115, wherein a concentration of carbon atoms may range from approximately 1.5 atomic percent to approximately 4 atomic percent and even more, depending on the specifics of the implantation process 114. In one illustrative embodiment, the implantation process 114 may be performed on the basis of appropriately selected implantation energies and doses so as to substantially position the carbon ions within the substantially amorphized portion 113 with a concentration of approximately 1.5 atomic percent to 4 atomic percent, wherein a dose of approximately $5 \times 10^{15} - 5 \times 10^{16}$ ions/cm$^2$ may be employed. With respect to the size of the silicon/carbon material 115, a tilted implantation may also be used if a reduced offset to the channel region 103 is desired. Consequently, by using the implantation process 114, a moderately high concentration of carbon may be introduced into the drain and source regions 109 including the extensions 108, wherein a lateral offset of the silicon/carbon region 115 from the channel region 103 may be substantially determined by the thickness 107T and/or the specifics of the implantation process 114. Moreover, the process parameters of the implantations 112 and 114 may be selected such that the silicon/carbon region 115 is substantially completely located within the extension regions 108 and the drain and source regions 109. In this case, the electrical characteristics, defined by the PN junction 110, may be maintained, thereby providing a high degree of compatibility with conventional device manufacturing techniques without forming a silicon/carbon region, while additionally the advantage of a highly efficient strain-inducing source is achieved.

Figure 1D:
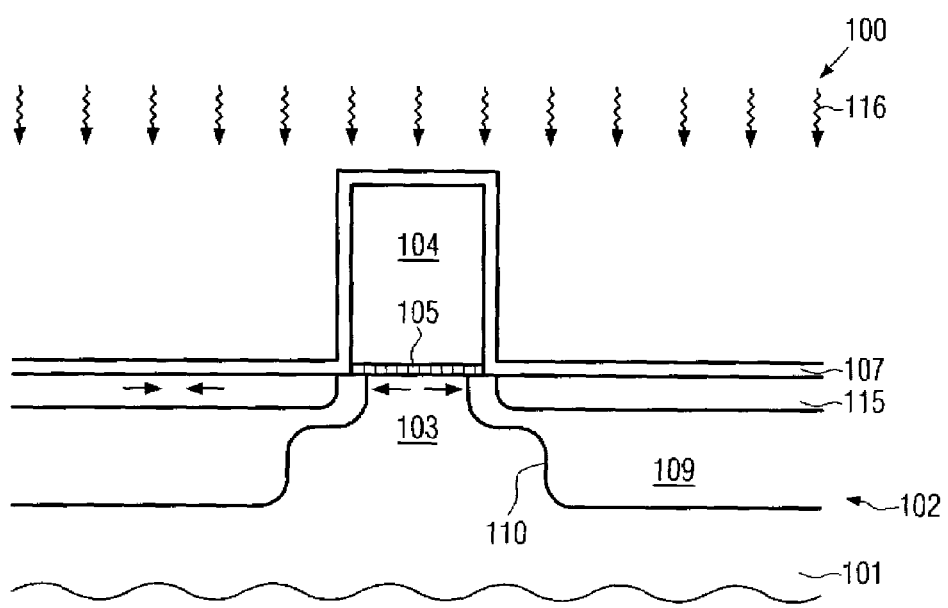

FIG. 1d schematically illustrates the semiconductor device 100 during a subsequent anneal process 116 for activating the implanted carbon atoms. In one illustrative embodiment, the anneal process 116 comprises a laser-based or flash-based anneal technique. During a laser anneal process, one or more short radiation pulses with a specified irradiation wavelength are created and directed towards the exposed device surface, as indicated in FIG. 1d, thereby depositing the respective energy in the irradiated material. Consequently, the irradiated areas are efficiently heated up to high temperatures imparting the required activation energy to the atoms, wherein, due to the short radiation pulses, the energy transfer and thus heating of the material is sufficient to provide a low distance motion of the respective silicon and non-silicon species, while a significant diffusion over extended path lengths is substantially suppressed. Consequently, the substantially amorphized portion including the moderately high carbon concentration in the region 115 may be efficiently re-crystallized, thereby activating the carbon species, i.e., placing a plurality of carbon atoms at lattice sites in a highly efficient manner without initiating a substantial diffusion of other non-silicon species, such as the N-type dopant material forming the PN junction 110. Thus, the dopant gradients at the vicinity of the PN junction 110 is substantially maintained, while the region 115 is efficiently transformed into a strained silicon/carbon material, thereby imparting a respective tensile strain to the channel region 103. In a flash-based anneal technique, similarly short radiation pulses may be provided wherein, contrary to a laser-based technique, multiple wavelengths may be present in the respective radiation, which may be advantageous for energy deposition when a plurality of different materials having different optical characteristics are present in the upper portion of the exposed device layers. It should be appreciated that the additional anneal process 116 for activating the carbon species in the region 115 may, although not substantially affecting the N-dopant species with respect to diffusion across extended path lengths, initiate an additional activation, thereby even further enhancing the degree of activation of the N-dopant in the drain and source regions 109 and the extensions 108. Consequently, the anneal process 116 may contribute to an even further enhanced performance gain of the device 100.

After the anneal process, the liner 107 may be removed or in other cases a further sidewall spacer structure may be formed on the liner 107.

Figure 1E:
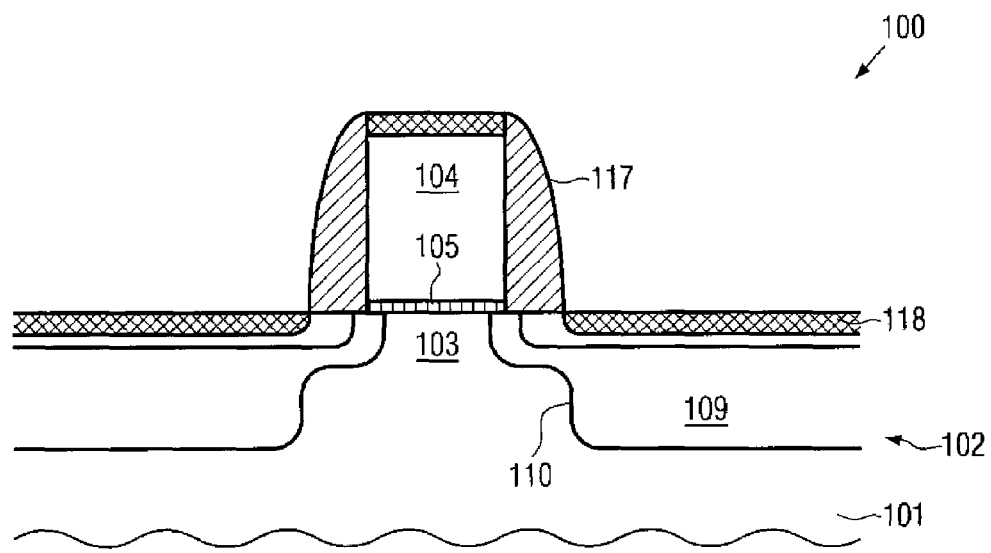

FIG. 1e schematically illustrates the semiconductor device 100 in a further advanced manufacturing stage in which a second sidewall spacer structure 117 is formed at sidewalls of the gate electrode 104, wherein the liner 107 may be incorporated in the spacer structure 117 or not, depending on the process strategy. In one illustrative embodiment, the second spacer structure 117 may be comprised of a dielectric material having a reduced relative permittivity compared to the first spacer structure 106, thereby reducing the parasitic capacitance between the gate electrode 104 and contact plugs to be formed so as to contact the drain and source regions 109 in a later stage. Moreover, the fringing capacitance of the gate electrode 104 with respect to the drain and source regions may also be reduced. In one illustrative embodiment, the second spacer structure 117 may be comprised of silicon dioxide, which has a reduced dielectric constant compared to silicon nitride, while, in other illustrative embodiments, the spacers 117 may comprise a low-k dielectric material. Moreover, the device 100 may comprise metal silicide regions 118 formed in the drain and source regions 109, that is, at least in the portion 115 of strained silicon/carbon material and also in an upper portion of the gate electrode 104. Since the metal silicide regions 118 may be formed on the basis of the second spacer structure 117, a high degree of reliability of the corresponding manufacturing process is ensured, while at the same time strained silicon/carbon material is maintained in the vicinity of the channel region 103 so that the stress relaxation caused by the metal silicide 118 may substantially not negatively impact the overall strain-inducing mechanism.

The device 100 as shown in FIG. 1e may be formed on the basis of the following processes. After removing the liner 107 or maintaining the liner 107, an appropriate spacer material, such as silicon dioxide, a low-k dielectric material and the like, may be deposited on the basis of well-established recipes. For example, conformal deposition techniques on the basis of chemical vapor deposition (CVD) are well-established for silicon dioxide and a plurality of low-k dielectric materials. Thereafter, a corresponding anisotropic etch process may be performed wherein, depending on whether the liner 107 has been maintained or removed, and depending on the material composition of the spacer material, appropriate etch strategies may be used for exposing the gate electrode 104 and the drain and source regions, i.e., the portion 115 while forming the spacer elements 117. Next, after any cleaning processes for preparing the exposed conductive or semiconductive areas, an appropriate silicidation sequence may be performed, for instance on the basis of refractory metals, such as nickel, platinum, cobalt or combinations thereof, so as to form the metal silicide regions 118. It should be appreciated that the corresponding process sequence for forming the second sidewall spacer structure 117 as well as the metal silicide regions 118 may also be performed in other device areas, such as P-channel transistors and the like. Consequently, the tensile strain material 115 may be positioned close to the channel region 103, wherein, in some illustrative embodiments, additionally a reduced parasitic capacitance is obtained by providing the second spacers 117 on the basis of a material exhibiting a reduced permittivity compared to conventional device strategies, in which typically silicon nitride is provided as spacer material.

Figure 1F:
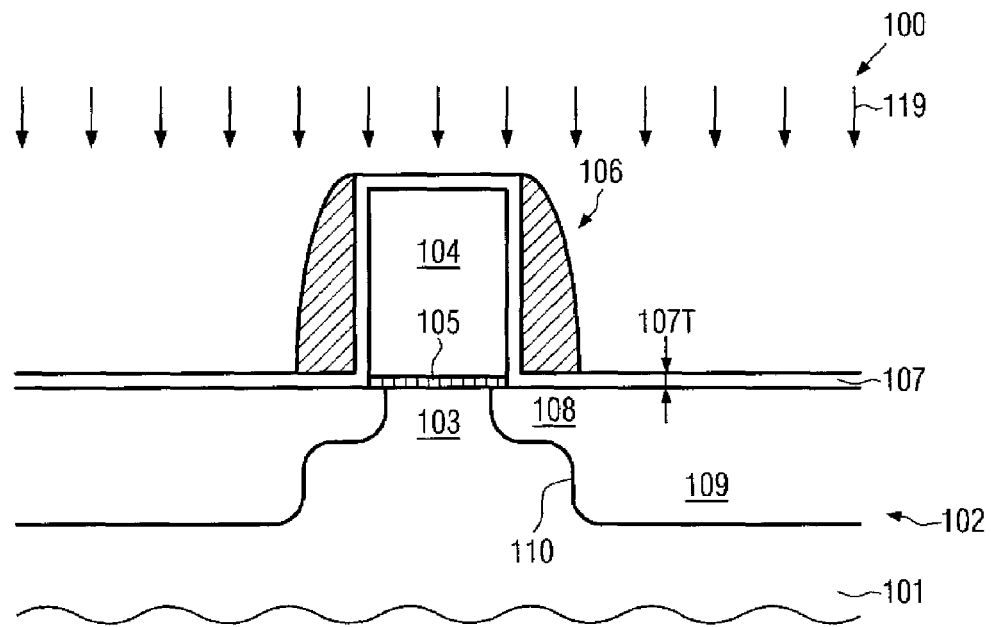
FIGS. 1f-1i schematically illustrate cross-sectional views of a transistor element receiving a strained silicon/carbon layer in addition to a stressed overlayer, which is positioned in close proximity to the channel region according to yet other illustrative embodiments of the present invention.
Figure 1G:
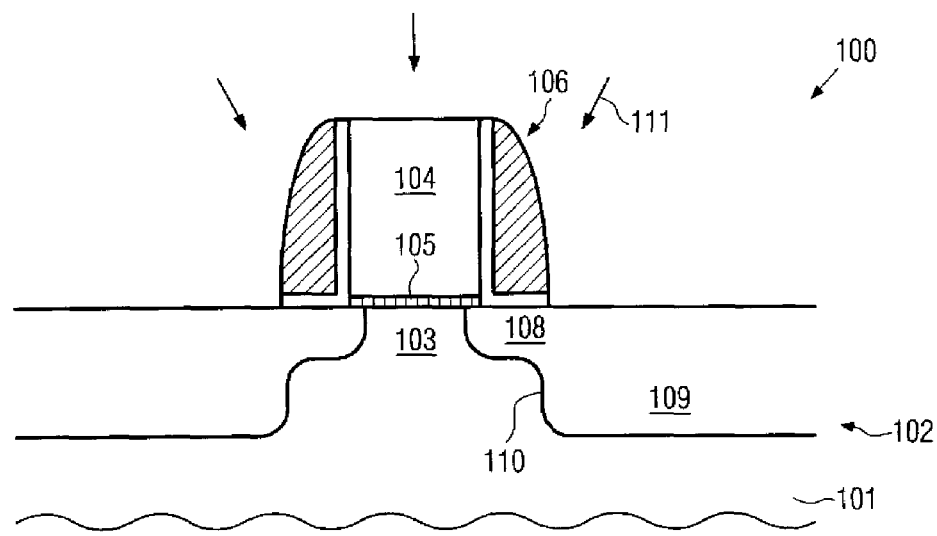
Figure 1H:
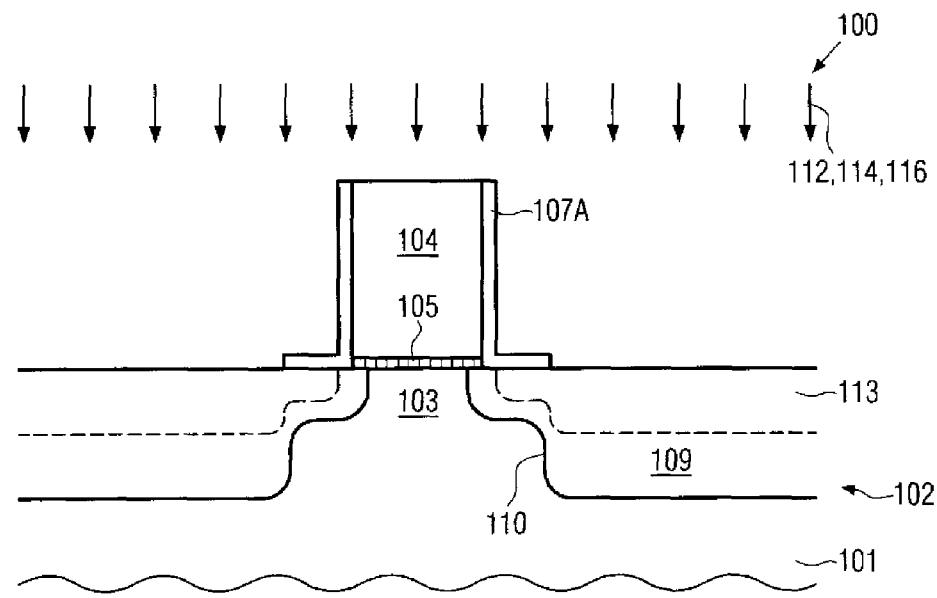

With reference to FIGS. 1f-1h, further illustrative embodiments of the present invention will now be described in more detail, in which the second spacer structure 117 as shown in FIG. 1e may be omitted to enable the formation of a stressed overlayer close to the gate electrode 104.

FIG. 1f schematically illustrates the semiconductor device 100 in a manufacturing stage substantially corresponding to the device 100 of FIG. 1a, wherein, prior to the removal of the first spacer structure 106, an appropriate selective etch process 119 may be performed in order to remove exposed portions of the liner 107. For instance, selective etch recipes for silicon dioxide and silicon are well-established in the art and may be used while, depending on the thickness of the liner 107, even isotropic etch recipes may be used, since a corresponding "under-etching" of the first spacer structure 106 may be tolerable. In other cases, anisotropic selective etch recipes may be used. It should be appreciated that a pronounced selectivity of the process 119 with respect to the liner 107 and the spacers 106 may not be required, especially if an anisotropic etch recipe is used, since in this case nevertheless a substantially L-shaped spacer will be created during the process 119, even if a significant portion of the first spacers 106 is also removed.

FIG. 1g schematically illustrates the device 100 after the etch process 119 and during the etch process 111 for selectively removing the spacer 106. For example, appropriate recipes having a moderately high selectivity with respect to silicon dioxide and silicon are available for silicon nitride, for instance on the basis of hot phosphoric acid, thereby enabling the removal of the spacer structure 106 substantially without unduly damaging the exposed portions of the gate electrode 104 and the drain and source regions 109.

FIG. 1h schematically illustrates the device 100 after the removal of the first spacers 106, thereby leaving resulting L-shaped spacer elements 107A, i.e., the residues of the liner 107. Thereafter, the device 100 may be subjected to the amorphization implantation 112, if required, wherein, due to the presence of the L-shaped spacers 107A, a slightly modified implantation profile may be created within the drain and source regions 109 and the extensions 108, as is shown in FIG. 1h. Consequently, the substantially amorphized portions 113 may have a modified shape compared to portions as shown in FIG. 1b. Thereafter, the carbon implantation 114 may be performed on the basis of substantially the same process parameters as previously described, wherein, also in this case, a slightly modified shape of the resulting silicon/carbon region may be obtained due to the different penetration depth into the drain and source regions 109 and the extension regions 108. Next, the anneal process 116 may be performed similarly as is described with reference to FIG. 1e in order to activate the implanted carbon species to thereby create the strained silicon/carbon region 115 having a modified shape compared to the region as shown in FIG. 1c. Thereafter, the silicidation process may be performed on the basis of the L-shaped spacers 107A, wherein the L-shape may provide the required offset of the corresponding metal silicide regions, thereby providing the desired process reliability as well as maintaining a respective strained silicon/carbon material adjacent to the channel region 103, in a similar way as is also described with reference to the second spacer structure 117 in FIG. 1e.

Figure 1I:
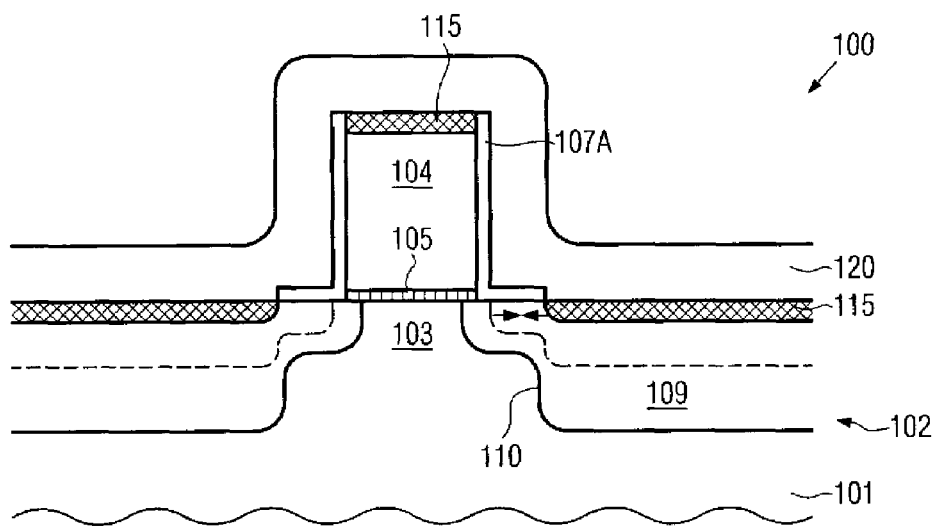

FIG. 1i schematically illustrates the semiconductor device 100 after the completion of the above-described process sequence. Consequently, the device 100 comprises the respective metal silicide regions 118 while maintaining strained silicon/carbon material of the region 115 in close proximity to the channel region 103. Moreover, the device 100 may comprise a stressed overlayer 120, such as a contact etch stop layer, which may be comprised of stressed silicon nitride material having a high tensile stress in order to even further enhance the respective tensile strain in the channel region 103. Due to the provision of the substantially L-shaped spacers 107A, the respective strained material of the layer 120 may be positioned in close proximity to the channel region 103, thereby significantly enhancing the stress transfer mechanism compared to strategies in which an additional spacer structure is provided. Consequently, in this case, the different strain-inducing sources, i.e., the strained silicon/carbon material 115 and the stressed overlayer 120, may be combined in a more efficient manner, since both strain-inducing sources are positioned very close to the channel region 103.

As a result, the present invention provides a highly efficient technique for positioning a strained silicon/carbon material next to the channel region of the respective N-channel transistor, thereby significantly enhancing the strain induced therein. To this end, the carbon incorporation is accomplished on the basis of an implantation process, which may be accompanied by a preceding pre-amorphization implantation and an appropriate anneal process, which provides efficient re-crystallization and carbon activation, while substantially reducing or suppressing out-diffusion of the dopant materials. It should be appreciated that, although in the embodiments described so far, the carbon implantation is performed in a very late stage of the transistor manufacturing process, a corresponding carbon implantation may also be performed in an earlier stage, when the respective process design of the anneal processes are appropriately designed. For instance, the carbon implantation may be performed together or after the formation of the extension regions 108, wherein a tilt angle may be used for the implantation of the extensions 108, while a substantially perpendicular implantation may be used for the carbon implantation, when different offsets of these implantation regions with respect to the channel region 103 are desired. In other cases, the extension implantation may be annealed separately and thereafter the carbon implantation may be performed prior to the formation of the deep drain and source regions, thereby avoiding the formation of an additional spacer structure. Thereafter, the deep drain and source regions as well as the carbon species may be annealed on the basis of an appropriate laser-based or flash-based sequence. In other illustrative embodiments, the pre-amorphization implantation 112 may be performed in the context of the formation of the drain and source regions 109 and/or the extensions 108 without being specifically designed for the incorporation of the carbon species. In still other illustrative embodiments, the extension implantation may be used for substantially pre-amorphizing a required portion of the drain and source regions prior to performing the carbon implantation 114.

Figure 2A:
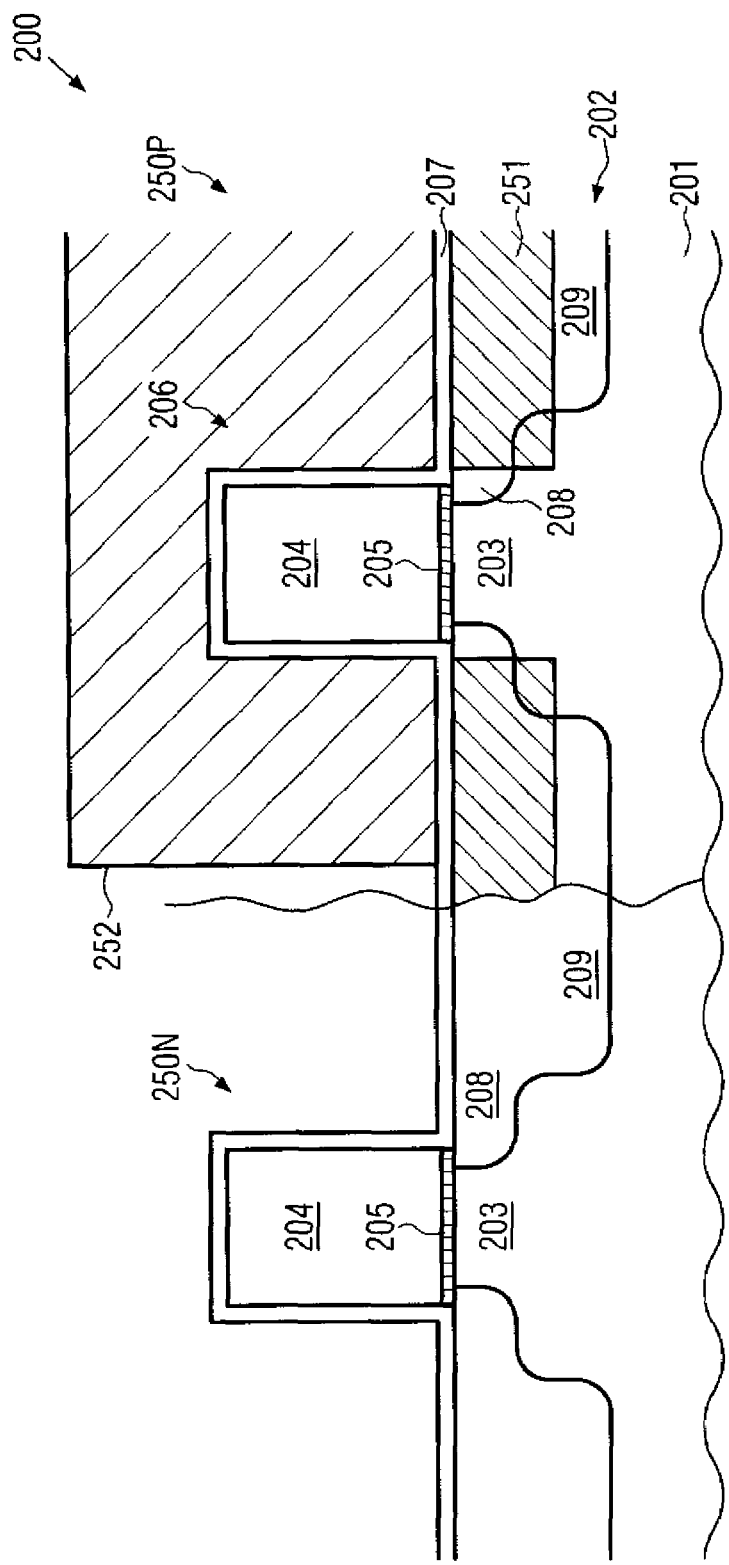
FIGS. 2a-2c schematically illustrate a semiconductor device having an N-channel transistor with silicon/carbon material and a P-channel transistor having a silicon/germanium material in the respective drain and source regions during various manufacturing stages in accordance with yet other illustrative embodiments of the present invention.
Figure 2B:
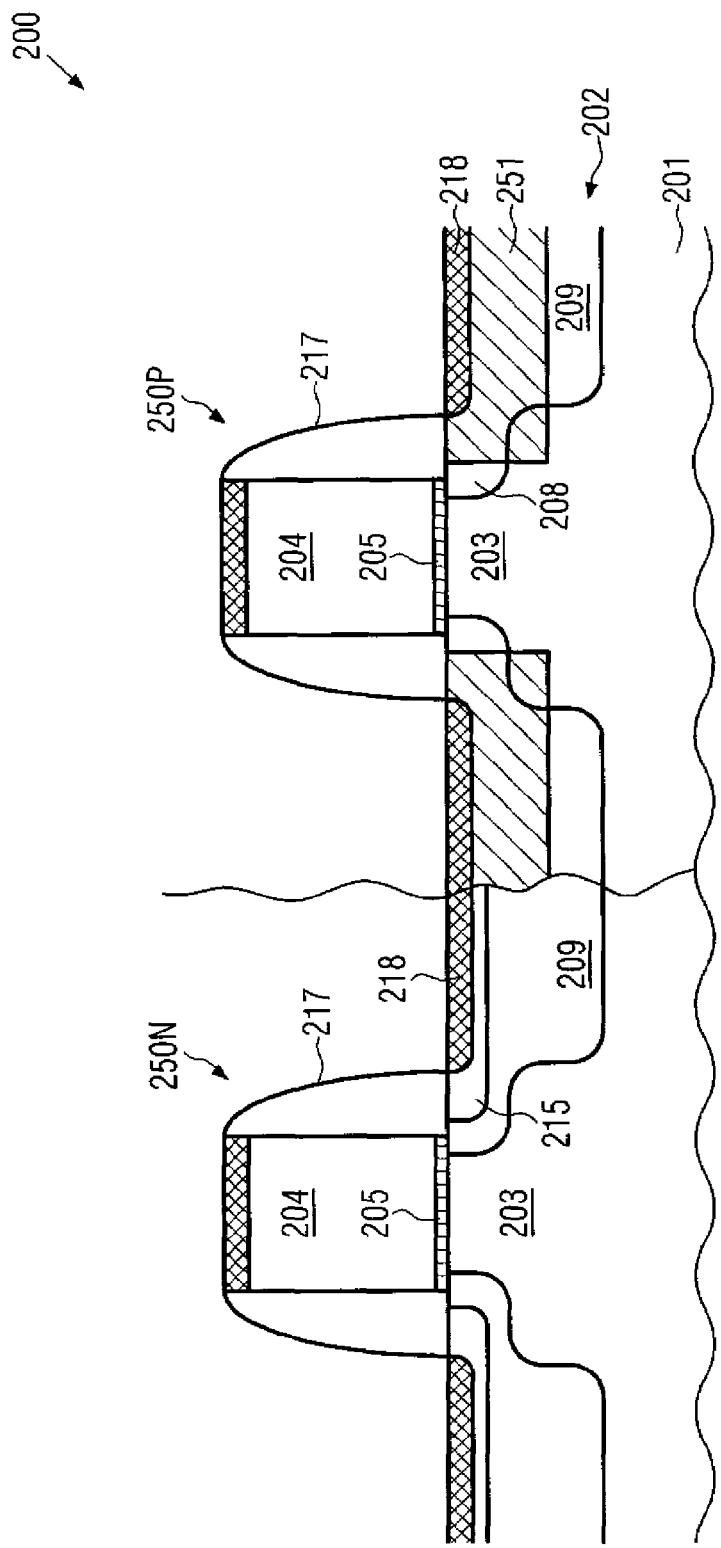
Figure 2C:
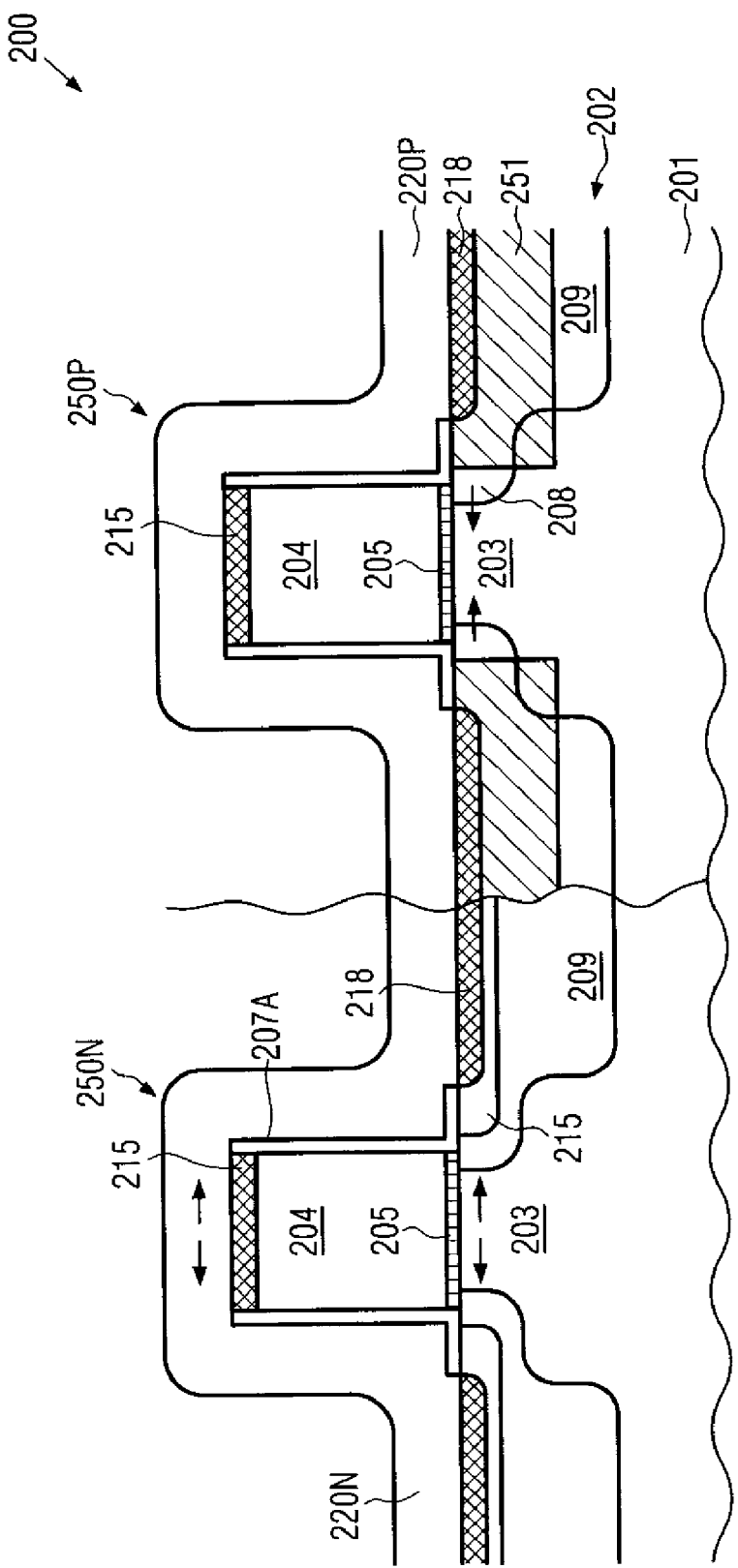

With reference to FIGS. 2a-2c, further illustrative embodiments of the present invention will now be described in more detail, in which a strained semiconductor material of a different type of strain may be formed in other device areas, such as P-channel transistors.

FIG. 2a schematically illustrates a semiconductor device 200 which may comprise a first device region 250N and a second device region 250P. The first and second device regions 250N, 250P may be located above respective regions of a substrate 201, which may represent any appropriate carrier material having formed thereon an appropriate silicon-based semiconductor layer 202. With respect to the characteristics of the substrate 201 and the silicon-based layer 202, the same criteria apply as previously explained with reference to the substrate 101 and the layer 102. In one example, the first region 250N may represent a region for forming an N-channel transistor, while the region 250P may represent a region for forming a P-channel transistor. In the manufacturing stage as shown in FIG. 2a, gate electrodes 204 may be formed on respective gate insulation layers 205, separating the respective gate electrodes 204 from respective channel regions 203. Moreover, corresponding drain and source regions 209 including extension regions 208 may be formed, wherein the respective regions may include dopants of different conductivity type corresponding to the respective conductivity type of the transistors formed in the first and second device regions 250N, 250P. Moreover, in one illustrative embodiment, the transistor formed in the region 250P may have formed in at least a portion of the regions 208, 209 a compressively strained semiconductor material, such as a silicon/germanium material 251. Furthermore, a liner 207, for instance comprised of silicon dioxide, may be conformally formed with an appropriate thickness above the device 200, while additionally the second device region 250P may be covered by an implantation mask 252, such as a resist mask or the like.

The semiconductor device 200 as shown in FIG. 2a may be formed on the basis of the following processes. After defining the respective regions 250N, 250P, for instance on the basis of shallow trench isolations and the like, appropriate implantation processes may be performed to define the specific dopant profile in the layer 202 within the device regions 250N, 250P. Thereafter, the gate electrodes 204 and the gate insulation layers 205 may be patterned on the basis of processes as previously described. Thereafter, an appropriate process sequence may be performed, in which the first device region 250N may be covered by any appropriate mask, while the gate electrode 204 of the second region 250P may be encapsulated and may be subjected to a corresponding cavity etch process for forming recesses and for subsequently filling the recesses with a strained semiconductor material by selective epitaxial growth techniques, as are well established in the art, for instance for silicon/germanium material. Depending on the device and process requirements, the silicon/germanium material may be provided as a highly in situ doped material, or a substantially intrinsic silicon/germanium material may be provided. Thereafter, the respective mask may be removed and also the corresponding encapsulation of the gate electrodes 204 may be removed and the further processing may be continued as is for instance described with reference to FIG. 1a for forming the drain and source regions 209 and the extensions 208 in the first device region 250N, wherein the second device region 250P may be covered by a corresponding implantation mask, such as the mask 252. It should be appreciated that the drain and source regions 209 and 208 in the second region 250P may be established on the basis of ion implantation and/or in situ doping as required, wherein when implantation processes are used, the first region 250N may be covered according to well-established CMOS implantation techniques. During the formation of the drain and source regions and the extensions 209, 208, the liner 207 may have been formed along with a corresponding spacer structure used for profiling the drain and source regions 209, which may be removed in both device regions 250N, 250P. Next, the implantation mask 252 may be formed on the basis of well-established photolithography techniques and thereafter an implantation process 214 may be performed to selectively introduce carbon ions into the first device region 250N, wherein a corresponding pre-amorphization implantation may be performed prior to the process 214, if required. Thereafter, the implantation mask 252 may be removed and a corresponding anneal process, which may substantially suppress out-diffusion, while efficiently activating the implanted carbon species, may be performed, as is for instance explained with reference to the anneal process 116.

As previously explained, during this additional annealing process, the N-dopant and P-dopant within the drain and source regions 209 and the extensions 208 in the first and second device regions 250N, 250P may additionally be activated, thereby enhancing the performance of both transistor types in these regions. In other illustrative embodiments, the activation and re-crystallization of the drain and source regions 209 and/or the extension regions 208 may also be entirely performed during this anneal process, when a completely laser-based or flash-based anneal process is considered appropriate. In other cases, the laser-based or flash-based anneal process may be combined with a heat treatment at moderately low temperatures of approximately 500-700° C. in order to efficiently re-crystallize amorphized or damaged portions without inducing a significant dopant diffusion activity, while an effective activation is obtained on the basis of the laser-based or flash-based anneal process.

FIG. 2b schematically illustrates the semiconductor device 200 in a further advanced manufacturing stage, in which respective strained silicon/carbon regions 215 are formed in the first device region 250N based on the previous carbon implantation and the subsequent anneal process. Furthermore, respective sidewall spacer structures 217 may be formed on the respective gate electrodes in both regions 250N, 250P, wherein, in illustrative embodiments, the spacers 217 may be comprised of a dielectric material having a reduced dielectric constant relative to silicon nitride, such as silicon dioxide, or any other appropriate low-k dielectric materials. Moreover, based on the sidewall spacer structure 217, respective metal silicide regions 218 may be formed in the drain and source regions 209 and the gate electrodes 204 in both device regions 250N, 250P. The spacers 217 and the metal silicide regions 218 may be formed on the basis of the same process techniques as previously described with reference to the components 118 and 117.

Consequently, the formation of a strained silicon/carbon material 215 in close proximity to the respective channel region 203 may be efficiently combined with an appropriate integration scheme for forming the compressively strained semiconductor material 251, wherein a high degree of compatibility is obtained in view of existing techniques for selectively growing the strained material 251. In this case, the carbon implantation in the first device region 250N may be performed at any appropriate manufacturing stage, as is also explained with reference to the device 100, while substantially not negatively affecting the device in the second region 250P. In illustrative embodiments, when an additional anneal process is performed for activating the carbon species, an additional performance gain may also be achieved in the second device region 250P, thereby further enhancing the degree of activation of the respective P-dopants. Furthermore, the provision of sidewall spacers with reduced relative permittivity for the formation of corresponding metal silicide regions may further enhance the performance of both types of transistors due to the reduced parasitic capacitance. In addition, in other integration schemes in which, for instance, the strain-inducing species in the second device region 250P may be introduced by ion implantation, for instance by introducing a species of high covalent radius compared to germanium, a high degree of symmetry in the corresponding process sequence with respect to the carbon implantation may be obtained, thereby significantly reducing process complexity.

FIG. 2c schematically illustrates the device 200 in accordance with yet another illustrative embodiment, in which conformal or L-shaped spacers 207A are provided to enable the positioning of respective stressed overlayers 220N and 220P in close proximity to the respective channel regions 203. That is, the stressed overlayer 220N may be provided with high tensile stress, while the overlayer 220P may comprise a high compressive stress in order to correspondingly further enhance the respective strain-inducing mechanism. The layers 220N, 220P may be comprised of silicon nitride, which may be formed with high tensile and compressive stress on the basis of well-established plasma enhanced chemical vapor deposition techniques by respectively controlling the process parameters, such as deposition temperature, pressure, ion bombardment and the like. The corresponding conformal spacers 207A may be formed on the basis of similar process techniques as are previously described with reference to FIGS. 1e-1i.

As a result, the present invention provides an efficient technique for the formation of strained silicon/carbon material in close proximity to a channel region of an N-type field effect transistor, wherein a high degree of compatibility with conventional process techniques is achieved. Moreover, the incorporation of carbon on the basis of an implantation process in combination with an appropriate anneal process results in a significant efficiency increase of the strain-inducing mechanism substantially without negatively affecting the electrical characteristics of the transistor. On the contrary, the effects of the additional carbon implantation and the anneal process may even further enhance the overall performance of the respective N-type transistor as well as of other transistors, such as P-channel transistors, in that the degree of dopant activation may be increased and/or a spacer structure of reduced permittivity may be provided. Moreover, the incorporation of carbon species by means of implantation may be highly efficiently combined with respective integration schemes for providing a compressively strained semiconductor material in P-channel transistors, thereby significantly enhancing the overall performance of CMOS devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming drain and source regions by ion implantation using a first sidewall spacer structure adjacent to a gate electrode of a first silicon-based transistor;
    removing said first sidewall spacer structure;
    substantially amorphizing a portion of said drain and source regions of a first silicon-based transistor after removing said first sidewall spacer structure;
    implanting carbon into said substantially amorphized portion; and
    re-crystallizing said substantially amorphized portion to form a tensile strain layer in said drain and source regions.

2. The method of claim 1, wherein re-crystallizing said substantially amorphized portion comprises annealing said substantially amorphized portion by pulsed radiation.

3. The method of claim 1, wherein said first sidewall spacer structure is formed on a liner.

4. The method of claim 3, wherein said first sidewall spacer structure is removed by a selective etch process using said liner as an etch stop.

5. The method of claim 3, further comprising annealing said drain and source regions prior to implanting said carbon into said portion.

6. The method of claim 3, further comprising forming a second sidewall spacer structure after implanting said carbon into said portion.

7. The method of claim 6, wherein said second sidewall spacer structure is comprised of a dielectric material having a lower relative permittivity compared to said first sidewall spacer structure.

8. The method of claim 7, further comprising forming a metal compound in said drain and source regions and said gate electrode on the basis of said second sidewall spacer structure.

9. The method of claim 1, further comprising covering a second silicon-based transistor while substantially amorphizing said portion and implanting carbon into said portion.

10. The method of claim 9, wherein said second silicon-based transistor differs from said first silicon-based transistor device in its conductivity type.

11. The method of claim 9, wherein a first sidewall spacer structure of said second transistor is removed together with said first sidewall spacer structure of said first transistor in a common removal process.

12. The method of claim 11, wherein a second sidewall spacer structure is formed in said second transistor together with said second sidewall spacer structure in said first transistor in a common process.

13. A method, comprising:
    forming drain and source regions of a first transistor in a silicon-based semiconductor layer by ion implantation and a first anneal process;
    removing a first sidewall spacer structure from sidewalls of a gate electrode of said first transistor;
    implanting carbon into said drain and source regions after removing said first sidewall spacer structure; and
    performing a second anneal process to activate said carbon to form a tensile strain layer in said drain and source regions.

14. The method of claim 13, wherein said second anneal process comprises an anneal process on the basis of pulsed radiation.

15. The method of claim 13, wherein implanting said carbon is performed to obtain a local carbon concentration in said drain and source regions of at least approximately 1.5 atomic percent.

16. The method of claim 13, further comprising substantially amorphizing a portion of said drain and source regions prior to implanting said carbon.

17. The method of claim 13, further comprising forming a second sidewall spacer structure at sidewalls of said gate electrode after implanting said carbon and forming metal silicide in said drain and source regions on the basis of said second sidewall spacer structure.

18. A method, comprising:
forming drain and source regions by ion implantation using a first sidewall spacer structure adjacent to a gate electrode of a first silicon-based transistor;
substantially amorphizing a portion of drain and source regions of a first silicon-based transistor;
implanting carbon into said substantially amorphized portion;
covering a second silicon-based transistor while substantially amorphizing said portion and implanting carbon into said portion, wherein said second silicon-based transistor differs from said first silicon-based transistor device in its conductivity type; and
re-crystallizing said substantially amorphized portion to form a tensile strain layer in said drain and source regions;
removing a first sidewall spacer structure of said second transistor together with said first sidewall spacer structure of said first transistor in a common removal process.

19. The method of claim 18, further comprising:
forming a second sidewall spacer structure on said first transistor after implanting said carbon into said portion; and
forming a second sidewall spacer structure on said second transistor together with said second sidewall spacer structure in a common process.

20. The method of claim 19, wherein said second sidewall spacer structure is comprised of a dielectric material having a lower relative permittivity compared to said first sidewall spacer structure.

21. The method of claim 20, further comprising forming a metal compound in said drain and source regions and said gate electrode on the basis of said second sidewall spacer structure.

* * * * *